United States Patent

Mancini et al.

[11] Patent Number: 6,083,806
[45] Date of Patent: Jul. 4, 2000

[54] METHOD OF FORMING AN ALIGNMENT MARK

[75] Inventors: David P. Mancini, Fountain Hills; Douglas J. Resnick, Phoenix; Harland G. Tompkins, Chandler; Karen E. Moore, Phoenix, all of Ariz.

[73] Assignee: Motorola, Inc., Schaumburg, Ill.

[21] Appl. No.: 09/110,352

[22] Filed: Jul. 6, 1998

[51] Int. Cl.[7] .................................................. H01L 21/76
[52] U.S. Cl. ............................................................ 438/401
[58] Field of Search ..................................... 438/401, 400; 148/DIG. 102

[56] References Cited

U.S. PATENT DOCUMENTS

| | | |
|---|---|---|
| 5,042,945 | 8/1991 | Shibata et al. . |
| 5,144,747 | 9/1992 | Eichelberger . |
| 5,188,876 | 2/1993 | Hensel et al. . |
| 5,270,222 | 12/1993 | Moslehi ...................................... 438/7 |
| 5,506,421 | 4/1996 | Palmour . |
| 5,553,110 | 9/1996 | Sentoku et al. . |
| 5,554,561 | 9/1996 | Plumton . |
| 5,610,085 | 3/1997 | Yuan et al. . |
| 5,624,860 | 4/1997 | Plumton et al. . |
| 5,681,762 | 10/1997 | Baliga ...................................... 438/173 |
| 5,712,189 | 1/1998 | Plumton et al. . |
| 5,917,205 | 6/1999 | Mitsui et al. ........................... 257/202 |
| 5,972,793 | 10/1999 | Tseng ...................................... 438/692 |
| 6,015,750 | 1/2000 | Bruce et al. ........................... 438/636 |

*Primary Examiner*—Richard Booth
*Assistant Examiner*—Jennifer M. Kennedy
*Attorney, Agent, or Firm*—Daniel R. Collopy; William E. Koch

[57] ABSTRACT

An alignment mark (51) is formed on the surface (64) of a silicon carbide substrate (50). The alignment mark (51) is used to reflect a light signal (72) to determine the proper position for the silicon carbide substrate (50). The materials that are used to form the alignment mark (51) can be used to form an alignment mark on any transparent or semi-transparent substrate and will maintain physical integrity through very high temperature processing steps.

20 Claims, 2 Drawing Sheets

METHOD OF FORMING AN ALIGNMENT MARK

BACKGROUND OF THE INVENTION

This invention relates, in general, to semiconductor devices, and more particularly to methods for aligning a substrate during the formation of semiconductor devices.

To meet the ever increasing customer demands for high performance semiconductor devices, the fabrication of semiconductor devices in silicon carbide substrates has been explored as an alternative to silicon substrates. Due to the small size of silicon carbide substrates commercially available today, there is very little state-of-the art processing equipment available for processing these substrates. Thus older, refurbished equipment must often be used.

Nevertheless, a need exists to provide techniques for processing stand-alone silicon carbide substrates. In particular, a need exists for aligning a silicon carbide substrate during the various process steps that require the silicon carbide substrate to be accurately positioned within the processing equipment. For example, photolithographic processes require that the silicon carbide substrate be accurately aligned so structures that provide the semiconductor device can be properly patterned.

Figure 1:
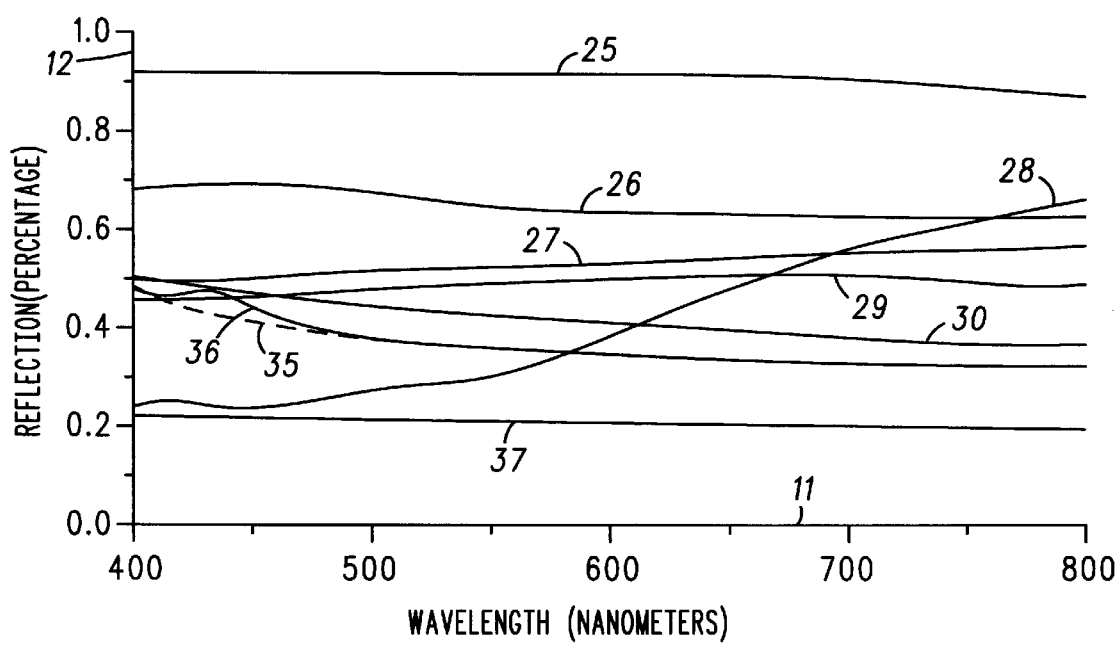
FIG. 1 is a graph illustrating the optical properties of some materials used in accordance with embodiments of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

Simply stated, the present invention provides structures that can be used to form alignment marks on silicon carbide substrates. The manufacturing process for making semiconductor devices in a silicon carbide substrate often requires that the silicon carbide substrate be properly aligned to processing equipment. Conventionally in the manufacturing of devices in silicon substrates, an alignment mark is patterned along the periphery of the silicon substrate or around individual devices across the silicon substrate. When alignment of the silicon substrate is required, a light signal is directed towards the alignment mark, and the silicon substrate is positioned to maximize the light signal that is reflected off the alignment mark. Once the maximum light signal is reflected off the alignment mark on the silicon substrate, it is assumed that the silicon substrate is properly aligned The inventors have discovered that the materials typically used to form alignment marks on silicon substrates are not viable alternatives that can be used for processing silicon carbide substrates. This is due in part to the optical properties of both the materials used to form alignment marks on silicon substrates and the optical characteristics of silicon carbide substrates. In addition, the processes used to form semiconductor devices in silicon carbide substrates have an adverse effect on the materials used to form alignment marks on silicon substrates. As described below, the optical properties of materials used in the processing of silicon substrates have been extensively studied to identify the source of the problem. In addition, alternative solutions have been discovered that address the problems of processing silicon carbide substrates.

FIG. 1 is a graph 10 illustrating the optical properties of materials that are used to manufacture silicon substrates and silicon carbide substrates in accordance with embodiments of the present invention. An x-axis 11 plots the wavelength of a light signal in nanometers (nm) versus the percentage (in percent of 100) of the light signal that is reflected along a y-axis 12. Various lines 25–30 indicate the percentage of light that is reflected for different materials that are used to form alignment marks. Lines 35–37 indicate the percentage of light that is reflected by various substrate materials. In particular, a line 35 indicates the reflective properties of a conventional silicon substrate and a line 36 indicates the properties of a gallium arsenide substrate.

In general, silicon substrates and gallium arsenide substrates reflect about thirty-five percent of the light at a wavelength of about 500 nm to 800 nm. In other words, about sixty-five percent of the light is either transmitted or absorbed by the substrate. That is why silicon substrates and gallium arsenide substrate are generally considered to be non-transparent. In contrast, a silicon carbide substrate (indicate with a line 37) reflects only about twenty to twenty-five percent of the light. This is why stand-alone silicon carbide substrates are considered transparent. Other substrate materials such as quartz, glass, and sapphire have similar optical properties as silicon carbide, and thus, can benefit from the alignment mark structures of the present invention. Even more generally, the present invention can be used with any substrate that reflects less than about 30 percent of a light signal having a wavelength of 400 to 800 nanometers.

Ideally, alignment marks should be made from a material that is as reflective as possible. For example, alignment marks on silicon substrates are formed from fine grain metals or silicon itself. As evidenced by lines 25 and 26, respectively, aluminum and chrome reflect over sixty percent of light having a wavelength of 400 nm to 800 nm. However, alignment marks made from materials with low melting temperatures, such as aluminum are not viable choices for use on silicon carbide substrates. The formation of semiconductor devices in silicon carbide substrates involves many high temperature processing steps. Typically, the manufacture of a semiconductor device in a silicon carbide substrate involves heating the substrate to a temperature in excess of about 900 degrees Celsius (° C.). This is done for example to activate dopants or to form ohmic electrical contacts to the silicon carbide substrate.

It has been discovered that elevated temperatures associated with the processing of a silicon carbide substrate change the optical properties of some materials used in the manufacture of devices on silicon substrates. During high temperature processing, the average grain size of some materials such as aluminum increases significantly. For example, following a high temperature processing step, it is not uncommon for an alignment mark made from aluminum to have an average grain size of 1,000 nm or more. This becomes a problem with dark field optical alignment systems used to align silicon carbide substrates because large grain boundaries cause light signals to scatter from within the mark, causing an overall reduction in contrast and in the overall alignment signal that is reflected off the alignment mark.

Most dark field alignment processes illuminate a substrate by directing a light signal having a wavelength ranging from about 400 nanometers to 800 nanometers towards the substrate to be aligned. Consequently, the alignment light signal reflects poorly off an alignment mark made from thermally cycled aluminum or chrome because the average grain size of the alignment mark is greater than the wavelength of the light signal. This is why applicants have determined that materials such as aluminum and nickel cannot be used to form alignment marks on a silicon carbide substrate.

In accordance with the embodiments of the present invention described below, applicants have discovered that materials such as tantalum silicide, tungsten, titanium nitride, and chrome are well suited to form alignment marks on substrates that are transparent or semi-transparent. As shown in graph 10 of FIG. 1 with a line 27, tantalum silicide reflects from about fifty percent to about sixty percent of light over the operating range of most dark field alignment systems. Similarly, tungsten, indicated with a line 29, reflects from about forty-five percent to fifty percent of light, titanium nitride, indicated with a line 28, reflects about twenty-five to seventy percent, and amorphous silicon, indicated with a line 30, reflects about thirty-five percent to fifty percent of light. However, to achieve the desired results with amorphous silicon, it may be necessary to deposit a layer that is too impractical for processing.

It should be noted that mere determination of the reflecting characteristics of a given material is not sufficient to determine that the material is well suited for use with transparent substrates. The material must also be tolerant of the high temperature processing steps associated with forming semiconductor devices in a silicon carbide substrates. Preferably, the material used to form alignment marks on silicon carbide substrates should have a melting temperature greater than about 1500° C. More preferably, the material has a melting temperature in excess of 1800° C., and better still, a melting temperature greater than about 2800° C. Of the materials illustrated in graph 10 of FIG. 1, tungsten has a melting temperature of 3422° C., titanium nitride has a melting temperature of 2980° C., and chrome has a melting temperature of about 1907° C.

The relatively high melting temperatures of the materials used to form alignment marks in accordance with the present invention allow the materials to resist changing their optical properties when exposed to high temperature processing steps. In addition, the materials also have an average grain size that is significantly smaller than the wavelength of the optical signals used in most processing equipment. Ideally with a dark field alignment process, the average grain size of the material used to form the alignment mark is less than or equal to about 10 percent of the wavelength of the light signal used to align the substrate. Materials such tantalum silicide, tungsten, and the like have an average grain size that is less than or equal to about 200 nanometers. Some of the materials suggested have an average grain size of less than or equal to about 100 nanometers, and even less than or equal to about 50 nanometers.

An alignment mark formed in accordance with the present invention has an average grain size that is significantly less than the wavelength of light that is used to align a substrate. The grain boundaries of large grain materials provide discontinuities that reflect the optical signal, thereby lowering the contrast of the edge to be detected . Another issue that must be considered in selecting a material to be used to form alignment marks is the optical properties of the substrate. In particular, silicon carbide substrates are nearly transparent compared to conventional silicon substrates. As shown in graph 10 of FIG. 1, silicon carbide substrates only reflect less than twenty-five percent of light having a wavelength used with most alignment systems. In contrast, silicon substrates reflect nearly twice as much light over the same wavelengths. This is part of the reason why the materials used to form alignment marks on silicon substrates are not obvious candidates for use with silicon carbide substrates.

Figure 2:
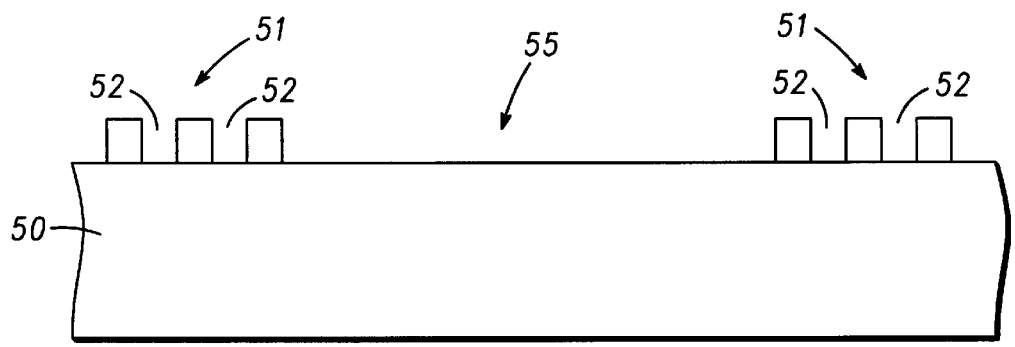
FIG. 2 is a cross-sectional view of a semiconductor device at an early stage of manufacture in accordance with an embodiment of the present invention.

Turning now to FIG. 2, a method for forming an alignment mark in accordance with the present invention is provided. FIG. 2 is a cross-sectional view of a silicon carbide substrate 50 upon which a semiconductor device 55 is to be formed. In FIG. 2, an arrow 55 is used to indicated the relative location where semiconductor device 55 is to be subsequently formed.

Alignment marks 51 are formed from a layer of material (not shown) that is patterned to have the desired optical characteristics. Alignment marks 51 can be formed by depositing a layer of tantalum silicide, tungsten, titanium nitride, chrome, or similar material using one of a variety of techniques know in the art. For example, the layer of material can be formed by a sputtering, a chemical vapor deposition (CVD), evaporation, or equivalent process. Preferably, the layer of material used to form alignment marks 51 is about 100 angstroms (Å) to 10,000 Å thick. Thereafter, a photolithographic pattern and etch, or liftoff, process can be used to pattern the material to provide alignment marks 51.

Figure 3:
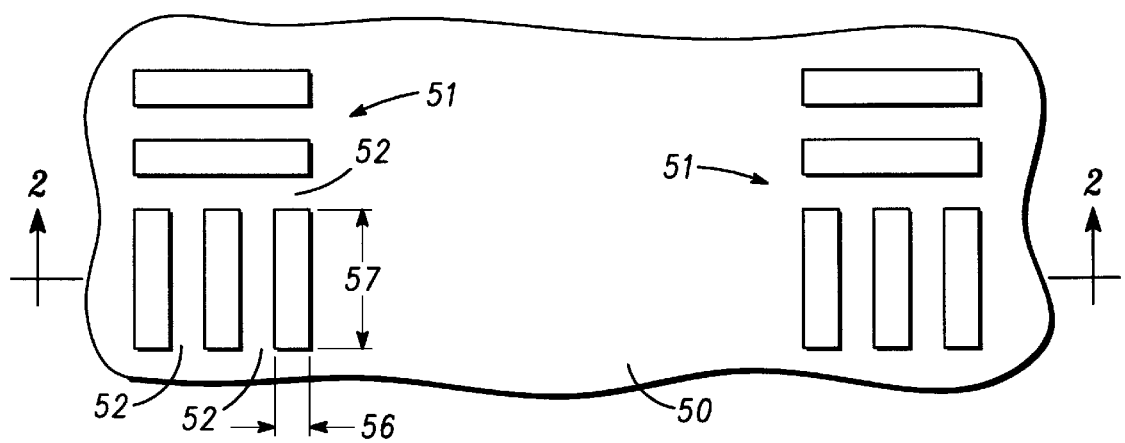
FIG. 3 is a top view of an alignment structure used in accordance with an embodiment of the present invention.

An example of a pattern that can be used to provide alignment marks 51 is illustrated in FIG. 3. FIG. 3 is a top view of silicon carbide substrate 50. Sectional line 2—2 is used to indicate the relative location of the cross-section shown in FIG. 2. Alignment marks 51 can comprise a plurality of trenches 52 formed in the layer of material that each have a width (indicated with a line 56) and a length (indicated with a line 57). The dimensions of trenches 52 can vary depending upon the optical requirements of the process used to subsequently align substrate 50. Preferably, trenches 52 have a width ranging from about 0.5 microns ($\mu$m) to 5 $\mu$m and a length of about 10 $\mu$m to 50 $\mu$m. It should be understood that the alignment mark of the present invention in no way is limited to the pattern shown in FIG. 3 as any alignment pattern known in the art could be used to provide alignment mark 51.

Figure 4:
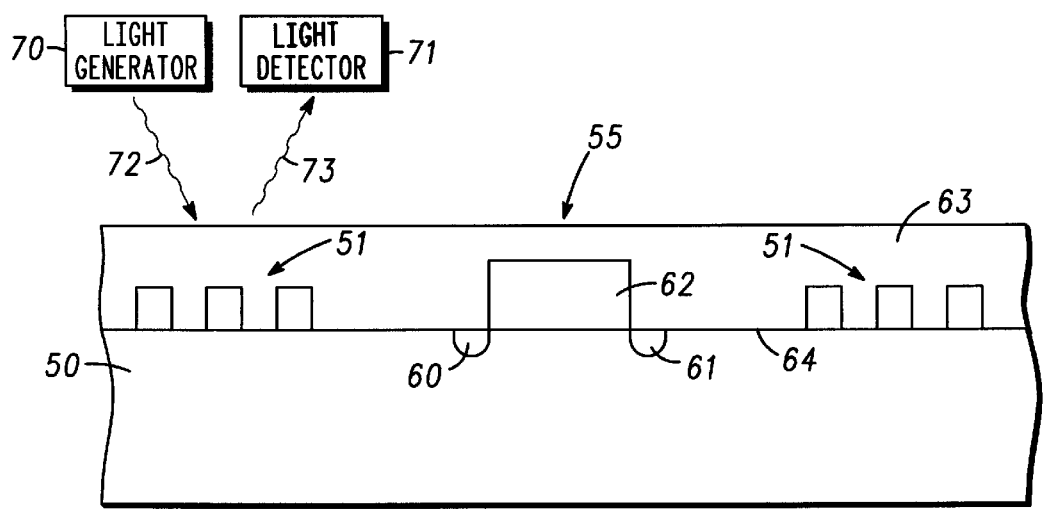
FIG. 4 is a cross-sectional view of the semiconductor device at a subsequent stage of manufacture in accordance with an embodiment of the present invention.

Referring now to FIG. 4, an example is provided for how alignment marks 51 can be used to align silicon carbide substrate 50 during the manufacture of semiconductor device 55. Semiconductor device 55 includes a gate structure 62 that modulates a current flow between a source region 60 and a drain region 61. The structure of semiconductor device 55 shown in FIG. 4 is meant only to be illustrative of one type of device that can be formed in silicon carbide substrate 50. It should be understood that the alignment marks of the present invention can be used to form any structure known in the art. In addition, the present invention can be used to form alignment marks on any substrate.

The formation of semiconductor devices in a silicon carbide substrate typically involves the use of photolithographic masking layers to define structures that make up the semiconductor devices. For example, the process of manufacturing semiconductor device 55 can include forming a layer of photoresist 63 on a surface 64 of silicon carbide substrate 50 prior to the step of aligning the silicon carbide substrate 50.

An alignment process, such as dark field alignment process, is then used to properly position silicon carbide substrate 50. The alignment process involves emitting a light signal (indicated in FIG. 4 with an arrow 72) from a light generator 70. Preferably, light signal 72 has a wavelength ranging from about 400 nm to 800 nm. Thus, the wavelength of light signal 72 is preferably at least four times larger than the average grain size of the material used to provide alignment mark 51. Light signal 72 reflects off alignment mark 51 to provide a reflected light signal (indicated with an arrow 73). A light detector 71 is used to measure the intensity of reflected light signal 73. Silicon carbide substrate 50 is moved to achieve that maximum intensity for reflected light signal 73. This indicates that silicon carbide substrate 50 is properly positioned.

The formation of semiconductor device 55 continues by exposing layer of photoresist 63 to form a pattern (not shown) in layer of photoresist 63 after the step of aligning the substrate. The pattern in photoresist layer 63 can be used to define the location of implanted doped regions or as a mask to etch structures that form semiconductor device 55.

By now it should be appreciated that the present invention provides alignment marks that are made from materials that are well suited for use with transparent or nearly transparent substrates. In general, the present invention has application for any substrate that reflects less than about 30 percent of a light signal that is directed to the surface of the substrate and has a wavelength of 400 nanometers.

The materials used in accordance with the present invention to provide an alignment mark have relatively high melting temperatures and average grain sizes that are about 5–30 percent of the wavelength of the light signal used in most alignment equipment. In addition, the materials typically reflect less than about 60 percent of a light signal having a wavelength of 400 nanometers.

One of the advantages of the present invention is that the materials used to form alignment marks can tolerate the high processing temperatures associated with the manufacture of semiconductor devices on a stand-alone silicon carbide substrate. Thus, the average grain size of the materials used to form the alignment marks remain sufficiently small through very high temperature processing steps, so that the alignment mark can be used effectively with dark field alignment systems.

What is claimed is:

1. A method of forming a semiconductor device comprising the steps of:

providing a substrate having a substrate surface;

forming an alignment mark overlying the substrate surface, wherein the alignment mark comprises a material having an average grain size; and aligning the substrate by directing a light signal towards the alignment mark, wherein the light signal has a wavelength that is at least four times larger than the average grain size of the material.

2. The method of claim 1 wherein the step of forming the alignment mark includes forming the alignment mark from material that reflects less than about 60 percent of a light signal having a wavelength of 400 nanometers.

3. The method of claim 2 wherein the step of forming the alignment mark includes forming the alignment mark from material that is selected from the group consisting of tantalum silicide, tungsten, titanium nitride, and chrome.

4. The method of claim 1 wherein the step of providing the substrate includes providing a substrate that reflects less than about 30 percent of a light signal having a wavelength of 400 nanometers.

5. The method of claim 4 wherein the step of providing the substrate includes providing a substrate selected from the group consisting of silicon carbide, quartz, glass, and sapphire.

6. The method of claim 1 wherein the step of forming the alignment mark includes forming the alignment mark from material that is at least 100 angstroms thick and has a trench that is at least 0.5 microns wide and 10 microns long.

7. The method of claim 1 wherein the step of forming the alignment mark includes forming the alignment mark from material that has an average grain size that is less than or equal to about 200 nanometers.

8. The method of claim 7 wherein the step of forming the alignment mark includes forming the alignment mark from material that has an average grain size that is less than or equal to about 100 nanometers.

9. The method of claim 8 wherein the step of forming the alignment mark includes forming the alignment mark from material that has an average grain size that is less than or equal to about 50 nanometers.

10. The method of claim 1 wherein the step of forming the alignment mark includes forming the alignment mark from material that has a melting temperature greater than about 1500° C.

11. The method of claim 10 wherein the step of forming the alignment mark includes forming the alignment mark from material that has a melting temperature greater than about 2800° C.

12. The method of claim 1 wherein the step of aligning the substrate includes directing a light signal having a wavelength ranging from about 400 nanometers to 800 nanometers.

13. The method of claim 1 further including the step of heating the substrate to a temperature in excess of about 900° C.

14. The method of claim 13 wherein the step of aligning the substrate includes illuminating the substrate with a dark field alignment process.

15. The method of claim 14 further comprising the steps of:

forming a layer of photoresist on the substrate prior to the step of aligning the substrate; and exposing the layer of photoresist to form a pattern in the layer of photoresist after the step of aligning the substrate.

16. A method of making a semiconductor device comprising the steps of:

providing a substrate having a substrate surface;

forming a layer of material overlying the substrate surface, wherein the layer of material has an average grain size;

forming an alignment mark from the layer of material; and aligning the substrate including the step of directing a light signal having a wavelength towards the alignment mark, wherein the average grain size of the layer of material is less than or equal to about 10 percent of the wavelength of the light signal.

17. The method of claim 16 wherein the step of forming the layer of material includes forming a layer of material that reflects less than about 60 percent of a light signal having a wavelength of 400 nanometers.

18. The method of claim 16 wherein the step of forming the layer of material includes forming a layer of material selected from the group consisting of tantalum silicide, tungsten, and titanium nitride.

19. The method of claim 18 wherein the step of providing the substrate includes providing a substrate that comprises a material selected from the group consisting of silicon carbide, quartz, glass, and sapphire.

20. The method of claim 16 wherein the step of forming the layer of material includes forming a layer of material that has an average grain size that is less than or equal to about 100 nanometers.

* * * * *